(12) United States Patent
Winterhalter et al.

(10) Patent No.: US 8,007,641 B2
(45) Date of Patent: Aug. 30, 2011

(54) METHOD OF DETECTING ARC DISCHARGES IN A PLASMA PROCESS

(75) Inventors: Markus Winterhalter, Bad Krozingen (DE); Peter Wiedemuth, Herbolzheim (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 956 days.

(21) Appl. No.: 11/534,240

(22) Filed: Sep. 22, 2006

(65) Prior Publication Data

US 2007/0073498 A1 Mar. 29, 2007

Related U.S. Application Data

(63) Continuation of application No. PCT/EP2005/002069, filed on Feb. 26, 2005.

(30) Foreign Application Priority Data

Mar. 25, 2004 (DE) .................. 10 2004 015 090

(51) Int. Cl.
| | |
|---|---|
| *C23C 14/00* | (2006.01) |
| *C23C 14/32* | (2006.01) |
| *H01J 17/26* | (2006.01) |
| *H01J 61/28* | (2006.01) |
| *H05B 37/02* | (2006.01) |
| *H05B 39/04* | (2006.01) |
| *H05B 41/36* | (2006.01) |
| *C23F 1/00* | (2006.01) |
| *H01L 21/306* | (2006.01) |

(52) U.S. Cl. ......... 204/192.13; 156/345.24; 156/345.28; 313/231.41; 313/231.71; 315/150; 204/192.1; 204/192.38

(58) Field of Classification Search ............. 204/192.38, 204/192.1, 192.13; 315/150; 324/409; 313/231.41, 313/231.71; 156/345.24, 345.28
See application file for complete search history.

(56) References Cited

U.S. PATENT DOCUMENTS

| | | | |
|---|---|---|---|
| 4,031,464 A | 6/1977 | Norberg | |
| 4,396,478 A | 8/1983 | Aizenshtein et al. | |
| | (Continued) | | |

FOREIGN PATENT DOCUMENTS

DE 4127504 2/1993
(Continued)

OTHER PUBLICATIONS

Ochs et al., "Advanced Power Supplies designed for Plasma Deposition and Etching", Vakuum In Forschung und Praxis, vol. 8, No. 5, Sep. 26, 2006, pp. 32-36.

(Continued)

*Primary Examiner* — Rodney G McDonald
*Assistant Examiner* — Michael Band
(74) *Attorney, Agent, or Firm* — Fish & Richardson P.C.

(57) ABSTRACT

An arc discharge detection device is used for detecting arc discharges in a plasma process. The arc discharge detection device includes a comparator to which an instantaneous signal and a reference value are supplied. The reference value is formed by a setting means from an extreme value of the signal. The extreme value is determined by an extreme value detection device within a predetermined time period, and the comparator changes the state of an arc discharge detection signal when the comparison between the reference value and an instantaneous value of the signal shows that an arc discharge has occurred.

12 Claims, 2 Drawing Sheets

U.S. PATENT DOCUMENTS

| | | | | |
|---|---|---|---|---|
| 4,588,952 | A | * | 5/1986 | Matsuoka ................. 324/409 |
| 4,625,283 | A | | 11/1986 | Hurley |
| 4,694,402 | A | | 9/1987 | McEachern et al. |
| 4,936,960 | A | | 6/1990 | Siefkes et al. |
| 5,192,894 | A | | 3/1993 | Teschner |
| 5,241,152 | A | | 8/1993 | Anderson et al. |
| 5,543,689 | A | | 8/1996 | Ohta et al. |
| 5,576,939 | A | | 11/1996 | Drummond |
| 5,611,899 | A | | 3/1997 | Maass |
| 5,698,082 | A | | 12/1997 | Teschner et al. |
| 5,718,813 | A | | 2/1998 | Drummond et al. |
| 5,729,145 | A | | 3/1998 | Blades |
| 5,804,975 | A | | 9/1998 | Alers et al. |
| 5,889,391 | A | | 3/1999 | Coleman |
| 5,993,615 | A | | 11/1999 | Abry et al. |
| 6,007,879 | A | | 12/1999 | Scholl |
| 6,060,837 | A | | 5/2000 | Richardson et al. |
| 6,063,245 | A | | 5/2000 | Frach et al. |
| 6,162,332 | A | | 12/2000 | Chiu |
| 6,213,050 | B1 | | 4/2001 | Liu et al. |
| 6,332,961 | B1 | | 12/2001 | Johnson et al. |
| 6,416,638 | B1 | | 7/2002 | Kuriyama et al. |
| 6,420,863 | B1 | | 7/2002 | Milde et al. |
| 6,472,822 | B1 | | 10/2002 | Chen et al. |
| 6,535,785 | B2 | | 3/2003 | Johnson et al. |
| 6,545,420 | B1 | | 4/2003 | Collins et al. |
| 6,621,674 | B1 | | 9/2003 | Zahringer et al. |
| 6,633,017 | B1 | | 10/2003 | Drummond et al. |
| 6,736,944 | B2 | | 5/2004 | Buda |
| 6,740,207 | B2 | | 5/2004 | Kloeppel et al. |
| 6,753,499 | B1 | | 6/2004 | Yasaka et al. |
| 6,783,795 | B2 | | 8/2004 | Inoue et al. |
| 6,791,274 | B1 | | 9/2004 | Hauer et al. |
| 6,859,042 | B2 | | 2/2005 | Parker |
| 6,878,248 | B2 | | 4/2005 | Signer et al. |
| 6,943,317 | B1 | | 9/2005 | Ilic et al. |
| 6,967,305 | B2 | | 11/2005 | Sellers |
| 7,016,172 | B2 | | 3/2006 | Escoda |
| 7,081,598 | B2 | | 7/2006 | Ilic et al. |
| 7,262,606 | B2 | | 8/2007 | Axenbeck et al. |
| 7,301,286 | B2 | * | 11/2007 | Kuriyama ................. 315/150 |
| 7,408,750 | B2 | | 8/2008 | Pellon et al. |
| 2003/0227290 | A1 | * | 12/2003 | Parker ................. 324/536 |
| 2004/0031699 | A1 | | 2/2004 | Shoji |
| 2004/0079733 | A1 | | 4/2004 | Kawaguchi et al. |
| 2004/0182697 | A1 | | 9/2004 | Buda |
| 2004/0212312 | A1 | | 10/2004 | Chistyakov |
| 2005/0051270 | A1 | | 3/2005 | Sasaki et al. |
| 2005/0093459 | A1 | | 5/2005 | Kishinevsky |
| 2005/0135025 | A1 | | 6/2005 | Escoda |
| 2006/0011473 | A1 | | 1/2006 | Kuriyama et al. |
| 2006/0054601 | A1 | | 3/2006 | Ilic et al. |
| 2006/0100824 | A1 | | 5/2006 | Moriya |
| 2006/0181816 | A1 | | 8/2006 | Pellon et al. |
| 2006/0213761 | A1 | | 9/2006 | Axenbeck et al. |
| 2007/0121267 | A1 | | 5/2007 | Kotani et al. |
| 2007/0168143 | A1 | | 7/2007 | Axenbeck et al. |
| 2007/0251813 | A1 | | 11/2007 | Ilic et al. |
| 2008/0121517 | A1 | | 5/2008 | Nitschke |
| 2008/0121625 | A1 | | 5/2008 | Zaehringer |
| 2008/0122369 | A1 | | 5/2008 | Nitschke |
| 2008/0133154 | A1 | | 6/2008 | Krauss |
| 2008/0216745 | A1 | | 9/2008 | Wiedemuth et al. |
| 2008/0218923 | A1 | | 9/2008 | Wiedemuth |
| 2008/0257869 | A1 | | 10/2008 | Nitschke et al. |

FOREIGN PATENT DOCUMENTS

| | | |
|---|---|---|
| DE | 43 26 100 | 2/1995 |
| DE | 4326100 | 2/1995 |
| DE | 4420951 | 12/1995 |
| DE | 19651615 | 7/1997 |
| DE | 19848636 | 5/2000 |
| DE | 10034895 | 2/2002 |
| DE | 10119058 | 10/2002 |
| DE | 102006002333 | 7/2007 |
| EP | 0713242 | 5/1996 |
| EP | 0 967 697 | 12/1999 |
| EP | 0 692 138 | 1/2004 |
| EP | 1 441 576 | 7/2004 |
| EP | 1 441 586 | 6/2006 |
| EP | 1705687 | 9/2006 |
| EP | 1720195 | 11/2006 |
| EP | 1 121 705 | 1/2009 |
| JP | 06132095 | 5/1994 |
| JP | 08-167500 | 6/1996 |
| JP | 08222398 | 8/1996 |
| JP | 09170079 | 6/1997 |
| JP | 2000117146 | 4/2000 |
| JP | 2005077248 | 3/2005 |
| WO | WO 94/25977 | 11/1994 |
| WO | WO 01/13402 | 2/2001 |
| WO | WO 03/037047 | 5/2003 |
| WO | WO 03/088445 | 10/2003 |
| WO | WO 2006/014212 | 2/2006 |
| WO | WO2006116445 | 11/2006 |

OTHER PUBLICATIONS

Van Zyl et al., "Managing Arcs in RF Powered Plasma Processes", Society of Vacuum Coaters, 48$^{th}$ Annual Technical Conference Proceedings, 2005, pp. 44-49.

Zlatanovic et al., "Glow-to-Arc Transition Instability Sensor in Processing Plasma", Proc. 20$^{th}$ International Conference on Microelectronics, vol. 2, Sep. 12-14, 1995, pp. 597-600.

International Preliminary Report on Patentability for corresponding PCT Application No. PCT/EP2005/002069, with translation, mailed Nov. 15, 2006, 25 pages.

Translation of Office Action from correspondence Japanese Application No. 2007-504279, dated Sep. 28, 2009, 4 pages.

Translation of the relevant parts of the Office Action fort corresponding European Patent Application No. 05 715 593.0, dated Aug. 19, 2010, 11 pages.

* cited by examiner

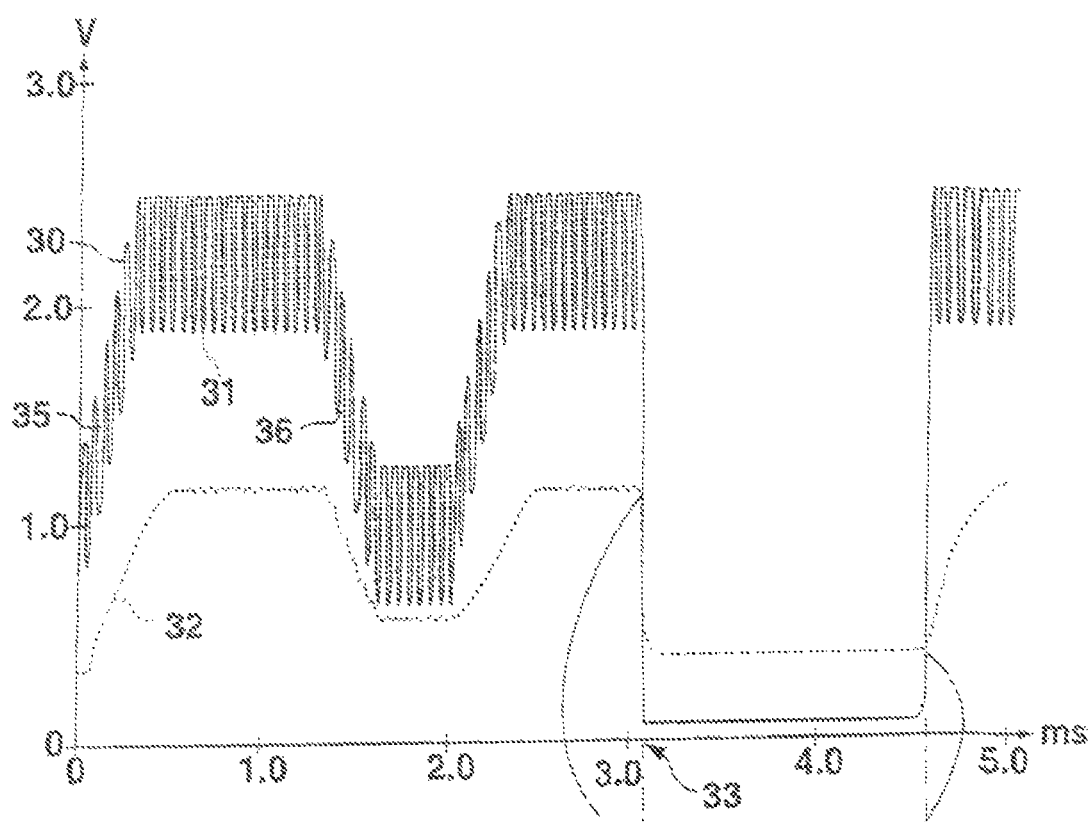
Fig. 2
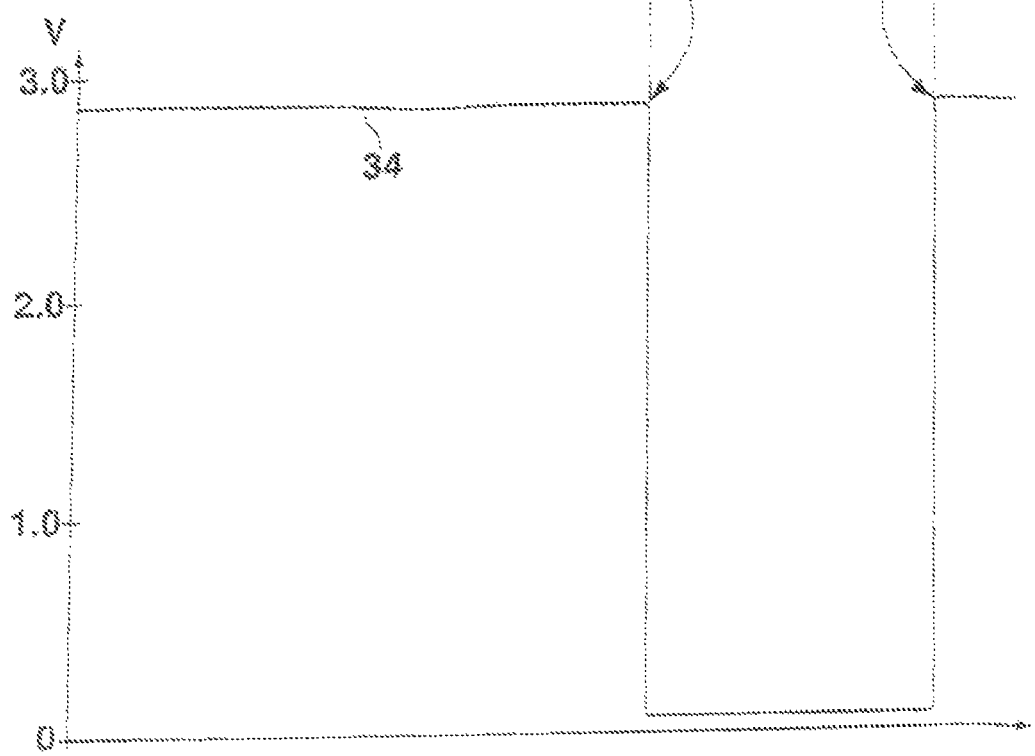

METHOD OF DETECTING ARC DISCHARGES IN A PLASMA PROCESS

CROSS REFERENCE TO RELATED APPLICATION

This application is a continuation of, and claims priority under 35 U.S.C. §120 to PCT/EP2005/002069, filed on Feb. 26, 2005, and designating the U.S., which claims priority from German application DE 10 2004 015 090.7, filed Mar. 25, 2004. Both of these priority applications are hereby incorporated by reference in their entirety.

TECHNICAL FIELD

The invention relates to an arc discharge detection device and a method for detecting arc discharges in a plasma process.

BACKGROUND

Plasma processes are used, e.g., in plasma processing and coating devices. Arcing frequently occurs in DC sputtering systems. During arcing, the current seeks an electrically conducting channel in the plasma. Such arcing occurs quite often, in particular, during the so-called reactive coating of a substrate. The reason for the frequent arcing is that not only the substrate but also parts of the sputter system, such as, e.g., the inner wall of the process chamber or parts of apertures, are coated with electrically non-conducting or poorly conducting materials, which are charged up to a breakdown voltage. Upon the occurrence of an arc, and to prevent serious damage to the sputter system, the current supply can be disconnected, the current can be temporarily interrupted, or the voltage at the plasma chamber can be short-circuited or commutated. In order to introduce these measures, however, the arc must first be detected. Therefore, arrangements for arc discharge detection (arc detection) and for deleting arc discharges (arcs) are often part of the plasma current supply.

Reliable detection of arcs is thereby important. A voltage drop or a current increase at the output of the plasma current supply are indications of an arc. Conventionally, a threshold value is manually preset for the voltage measured at the output of the plasma current supply. An arc is detected when the voltage falls below the threshold value. In another conventional method, a threshold value is manually preset for the current measured at the output of the plasma current supply. An arc is detected when this threshold value is exceeded.

DE 41 27 504 A1 describes a circuit arrangement for suppressing arcs, wherein the instantaneous value of the voltage of the plasma path is compared with a voltage value that corresponds to an average plasma voltage detected over a predetermined time period. If the difference between the instantaneous value and the detected average value exceeds a predetermined value, an arc is detected and the current supply to the plasma chamber is interrupted.

The predetermined value at which an arc is detected should be sufficiently large to prevent the residual ripple of the output voltage from being erroneously interpreted as an arc. Plasma processes often cover a wide output voltage range. The residual ripple may depend on the output voltage. The predetermined value at which an arc is detected should be sufficiently large to ensure that this value will not be reached, even with maximum residual ripple, and that no erroneous arc message is generated.

When a current supply is switched on, the plasma is initially not ignited. At a voltage depending on process parameters, such as pressure and geometry, the plasma is ignited and the load resistance changes from very large to low values. This results in a voltage drop that could be erroneously interpreted as arc. Also, the value that is associated with the occurrence of an arc should be sufficiently large to prevent erroneous detection of an arc. The predetermined time period during which the average value is formed may alternatively be varied to prevent erroneous detection of an arc.

For this reason, values that should actually be adjusted to ensure reliable detection of an arc, depend on other parameters and can no longer be optimally selected.

SUMMARY

Discussed in greater detail below are a method and a device for reliably detecting an arc discharge in a plasma process.

In one general aspect, a method for detecting arc discharge in a plasma process includes determining an extreme value of a signal within a predetermined time period, comparing an instantaneous value of the signal with the extreme value, and detecting an arc discharge when the comparison shows that the deviation of the instantaneous value, or a value proportional thereto, from the extreme value exceeds a predetermined deviation, or when the instantaneous value, or the value proportional thereto, reaches a reference value that can be determined from the predetermined deviation.

Implementations can include one or more of the following features. For example, the method can also include determining the predetermined deviation based on the extreme value. The predetermined deviation can be selected to be about 0.1 to about 0.5 times the extreme value. The predetermined deviation can be selected to be about 0.2 to about 0.4 times the extreme value.

The signal can be a signal proportional to an output voltage or an output current of a DC supply.

The extreme value can be determined by filtering the signal. The extreme value can be determined by determining a minimum value of the signal by filtering the signal. The filtering can be performed for rising and falling signal values using different time constants.

The method can include monitoring the ignition of the plasma of the plasma process. The arc discharge can be detected only when ignition of the plasma has been detected. The method can include filtering the extreme value using a first time constant when the plasma being ignited and using a second time constant when the plasma is extinguished.

The method can include predetermining a fixed threshold value, and detecting an arc discharge when the instantaneous value reaches the fixed threshold value. The method can include changing a signal level of an arc discharge detection signal upon detection of an arc discharge. The method can include changing the signal level of the arc discharge signal with a time delay when the arc discharge extinguishes.

The extreme value of the signal is determined in the predetermined time period, and an arc discharge is detected when the comparison shows that the instantaneous value or a value proportional thereto exceeds the extreme value by a predetermined value or when the instantaneous value or a value proportional thereto reaches a reference value that can be determined from the predetermined deviation. This means that the occurrence of this event is interpreted as the occurrence of an arc discharge. Whether the determined extreme value is a minimum value or a maximum value depends on the signal that is used for arc detection. It is feasible to use, e.g., the output voltage of a DC supply, which feeds the plasma process with direct current, as a signal. In this case, the minimum value of the voltage would be determined over a predetermined time period. Alternatively, the current fed into the plasma process may be used. In this case, the maximum value of the current would be determined over a predetermined time period. Whether the reference value is reached in that the instantaneous value exceeds or falls below the reference value also depends on the used signal.

When a minimum value is determined, the instantaneous value and the minimum value can, e.g., be compared by forming the difference between them and checking whether the difference exceeds a predetermined deviation. The instantaneous value may alternatively be compared with a reference value. In this case, it is observed whether the instantaneous value of the signal is larger or smaller than the reference value and, in particular when a minimum value is detected, whether an arc discharge is detected when the instantaneous value falls below the reference value. Towards this end, the reference value is determined from the minimum value and the predetermined deviation. By forming the extreme value, the deviation can be selected such that a residual ripple of the signal depending on the output voltage or the load current can be neglected.

In another implementation, the predetermined deviation is determined in dependence on the extreme value. In this way, the predetermined deviation is permanently adapted in dependence on the prevailing process conditions. In particular, it is not necessary to predetermine fixed deviations or reference values that must be reset for each process. This makes the use of a plasma system much more comfortable.

In one implementation, the predetermined deviation is selected to be 0.1 to 0.5 times, preferably 0.2 to 0.4 times the extreme value. This measure produces a safety margin, thereby preventing disturbances on the signal from being interpreted as an arc discharge.

A signal that is proportional to an output voltage of a DC voltage supply can be used as the signal. The output voltage can, in particular, be reduced to a lower voltage using a voltage divider to facilitate processing of this proportional voltage by a circuit arrangement. Moreover, a signal that is proportional to the output current can be used for arc discharge detection. When the output current or a signal proportional thereto is used for arc discharge detection, a maximum value of the signal is formed and the maximum value is compared to the instantaneous value of the signal. A difference between the values, which exceeds a predetermined deviation, is interpreted as an occurrence of an arc discharge.

An extreme value can be determined over a predetermined time period by filtering the signal. The extreme value can be determined in this fashion with particularly simple circuitry.

The minimum value can be filtered. Minimum value filtering is particularly facilitated by using different time constants for rising and falling signal values. In particular, during minimum value filtering, a larger time constant can be used for a rising flank, i.e., when the signal level of the signal changes from a low to a higher value, than for a falling flank, i.e., when the signal level changes from a high to a lower value. The time constants determine the time period in which the minimum value is searched.

Minimum value filtering can be performed in one stage. This is advantageous due to the small number of components required. Alternatively, minimum value filtering can be performed in several stages. This reduces the residual ripple at the filter output and permits faster transient effect in case of rapid negative voltage changes.

The plasma of the plasma process can be monitored to determine when it has been ignited. Arc discharge detection is useful mainly when the plasma of the plasma process has been ignited. When the plasma has not been ignited, no arcs can occur. Voltage drops occur, if at all, during ignition of the plasma but detection thereof is not necessary. The method for detecting arc discharges can be performed only when the plasma has been ignited. For this reason, in one implementation, arc discharge detection is performed only when ignition of the plasma has been detected.

Extreme value filtering can be performed with a first time constant when the plasma has been ignited, and with a second time constant when the plasma has been extinguished. Erroneous detection of arcs during ignition of the plasma due to voltage drops or current increases is thereby prevented.

A fixed threshold value can be predetermined and arc discharge can be detected when the instantaneous value has reached the fixed threshold value. Thus, when the output voltage or a voltage proportional thereto is monitored, i.e., a minimum value is searched as the extreme value, the occurrence of an arc discharge is detected when the instantaneous value falls below the fixed threshold value. If however, maximum values are detected as extreme values, it is possible that, when the instantaneous value exceeds the predetermined fixed threshold value, this may be interpreted as the occurrence of an arc discharge. This measure permits detection of arc discharges or short-circuits that develop only very slowly, e.g., due to insulating material overload in the cable.

The signal level of a current discharge detection signal can be changed when an arc discharge is detected. The arc discharge detection signal can be supplied to a control unit, e.g., a microprocessor, and defined reaction to the arc discharge detection is possible after a predetermined time period. It may be advantageous not to react immediately, but with a time delay, to the detection of arc discharge, e.g., by short-circuiting the output of the DC current supply or switching off the CD current supply. The measures taken in case of arc discharge detection are determined by the control unit. The time-delayed reaction to an arc discharge is advantageous if, e.g., impurities on the target or plasma chamber surface have produced the arc, and these impurities can be burnt in a defined manner within this time delay. In many plasma current supplies, the operating staff can adjust the time delay.

The signal level of the arc discharge signal can be changed with a time delay when the arc discharge is eliminated. This forms a kind of hysteresis, in particular, preventing that the arc discharge signal is reset after a short time when the arc burning voltage is high. This is important when the reaction to a change of the arc discharge signal indicating the occurrence of an arc is delayed.

In another general aspect, an arc discharge detection device detects arc discharges in a plasma process, which is supplied with a signal. The device includes a comparator emitting an arc discharge detection signal and receiving an instantaneous value of the signal or a signal proportional thereto, an extreme value detection device that receives the signal and determines an extreme value of the signal within a predetermined time period, and a setting means that receives the extreme value and generates a reference signal from the extreme value. The reference signal is supplied to the comparator, and the comparator changes the signal level of the arc discharge detection signal when the comparator detects that the instantaneous value has reached the reference signal.

Implementations can include one or more of the following features. For example, the extreme value detection device can include a filter means. The filter means can include an RC member, a second resistor, and a non-linear component. The second resistor and the non-linear component are connected in series with each other and are provided in parallel with the resistor of the RC member. The non-linear component can be a diode. The filter means can have several stages. The arc discharge detection device can include a first decoupling component disposed between the extreme value detection device and the comparator, and a second decoupling element. A fixed threshold value is coupled between the first decoupling element and the comparator via the second decoupling element. The first decoupling component can be a diode. The fixed threshold value can be a voltage. The second decoupling element can be a diode.

The arc discharge detection device can include a hysteresis circuit provided to control the instantaneous value of the signal supplied to the comparator.

The arc discharge detection device can include a plasma detection device that is connected to a switch-off device for switching off the arc discharge detection device.

The arc discharge detection device is supplied with a signal and includes a comparator emitting an arc discharge detection signal. The signal is supplied to an extreme value detection device for determining an extreme value of the signal over a predetermined time period. A setting means generates a reference signal from the extreme value, which is also supplied to the comparator together with an instantaneous value of the signal or a proportional signal. The comparator changes the signal level of the arc discharge detection signal when the comparator detects that the instantaneous value has reached the reference signal. This means permits reliable detection of arc discharges even when the signal changes during the process and when the signal has certain ripples or fluctuations.

The arc discharge detection device can include a setting means for setting the reference value. Thus, the reference value can be adaptively adjusted in dependence on the plasma process. In this case, it is not required to preset fixed to preset fixed reference values that must be repeatedly readjusted to different processes.

The extreme value detection device can include a filter means. The filter means determines extreme values for a predetermined time period in a single manner. The filter means can be designed as a filter of first or higher order.

The filter means can include an RC member, wherein a second resistor and a non-linear component connected in series thereto, preferably a diode, are provided in parallel with the resistor of the RC member. A filter means of this type can realize, in particular, a minimum value fiber. Due to the fact that a second resistor is connected in parallel with the resistor of the RC member, different time constants can be used for rising and falling signals values. During signal decay, a high rise time constant and a low time constant may, in particular, be realized. Filtering prevents rapid signal changes, e.g., voltage changes during set-point steps, from being erroneously interpreted as arcs.

The filter means can have several stages. The first stage realizes high residual ripple and slow decay in case the voltage rapidly drops down to low values. The second stage, i.e., a two-stage filter, realizes low residual ripple and rapid decay in case of rapid voltage changes to low values. The expense for the components of a two-stage filter is only slightly higher than of a one-stage filter.

A first decoupling component, in particular, a diode, can be disposed between the extreme value detection device and the comparator, and a fixed threshold value, in particular a voltage, is coupled between the first decoupling element and the comparator via a second decoupling element, in particular a diode. The threshold value serves as additional safety for low output voltages in order to prevent detection of arcs in such situations. Moreover, short-circuits that develop only very slowly, e.g., when the insulating material in the cables is overloaded, can be detected using the fixed threshold value.

Resetting of the arc discharge detection signal after a short time at high arc drop voltages can be reduced or prevented by providing a hysteresis circuit to control the instantaneous value of the signal supplied to the comparator. This measure ensures that the arc is actually eliminated when the discharge detection signal has reassumed its original state, indicating no arc.

A plasma detection device can be provided. The plasma detection device is connected to a switch-off means for switching off the arc discharge detection device. The arc discharge detection device can be switched on with such a switch-off means when the plasma has been ignited and arcs can occur, and be switched off when the plasma is extinguished and generally no arcs will occur.

Further advantages will emerge from the description and the drawings. It is equally possible to use the features mentioned above and those listed in the following by themselves or in a plurality in any desired combinations. The embodiments that are shown and described are not to be understood as a definitive list, being rather of an exemplary nature for describing the invention.

DESCRIPTION OF THE DRAWINGS

FIG. 2 shows a simulation result of a simulation of the wiring diagram of FIG. 1.

Like reference symbols in the various drawings may indicate like elements.

DETAILED DESCRIPTION

Figure 1:
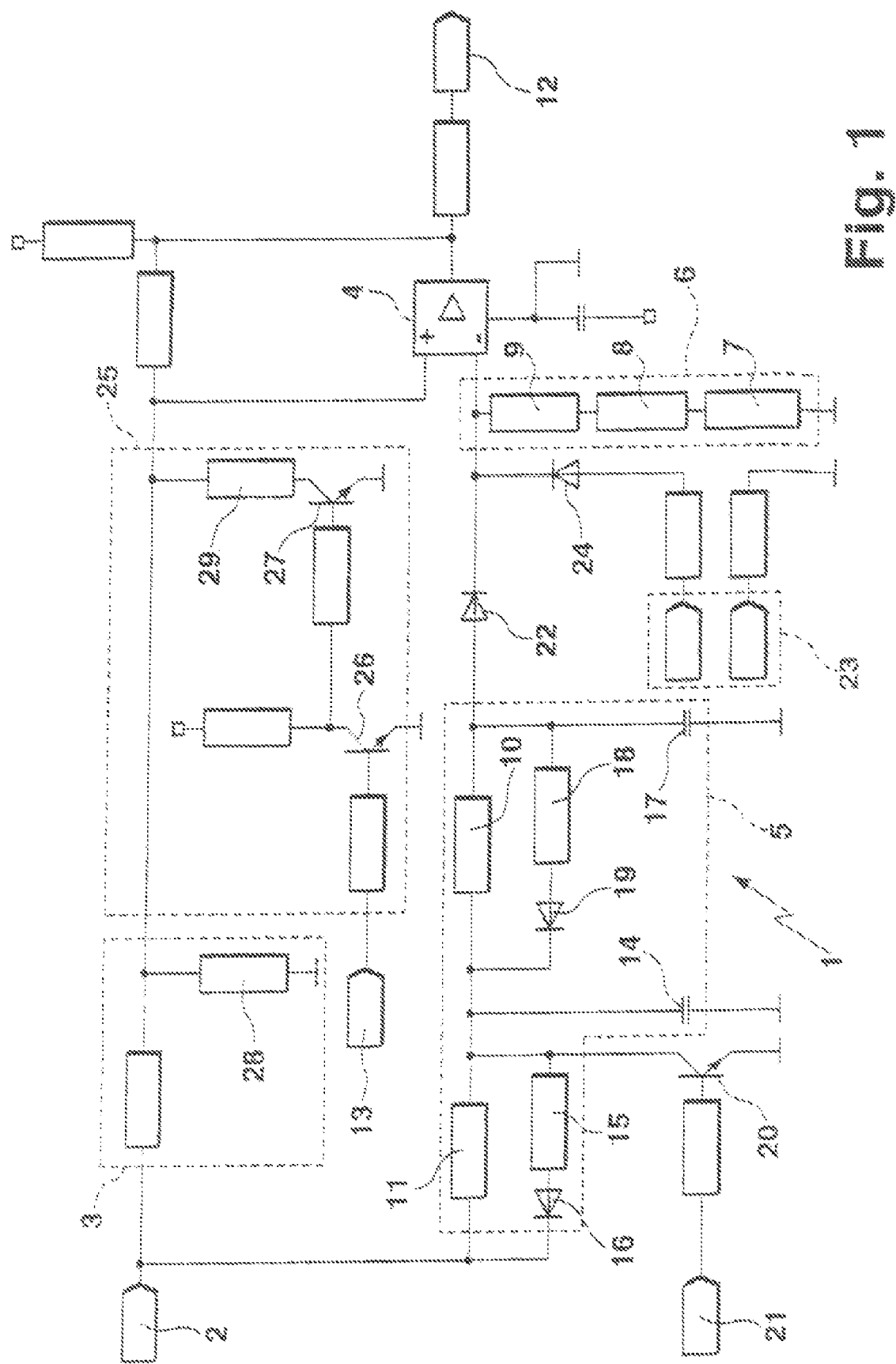
FIG. 1 shows a wiring diagram of an arc discharge detection device.

FIG. 1 shows a wiring diagram of an arc discharge detection device 1. At location 2, the arc discharge detection device 1 is provided with a signal, which, in the present embodiment, is proportional to the output voltage of a DC current supply that supplies current or voltage to a plasma process. This signal is further reduced by a voltage divider 3, such that an instantaneous value (I) of the signal, which is proportional to the output voltage, is supplied to the non-inverting input of a comparator 4 formed as operation amplifier.

The output of the comparator 4 produces an arc discharge detection signal at location 12 that may be changed when an arc is detected. The arc discharge detection signal at location 12 can be supplied to a control unit, e.g., a microprocessor. Defined reaction to an arc discharge detection is possible after a predetermined time period. It can be advantageous not to react (immediately) to the detection of an arc discharge, but react only after a time delay, e.g., by short circuiting the output of the DC current supply or by switching off the DC current supply. The control unit determines the means to take when an arc discharge is detected. The time delayed reaction to an arc discharge can be advantageous if, e.g., impurities on the target or plasma chamber surface have produced the arc, and these impurities can be burnt in a defined manner within the time delay. In many plasma current supplies, the operating staff can adjust the time delay.

The signal fed at location 2 is also supplied to an extreme value detection device 5 that determines an extreme value (E) of the signal fed at location 2 for a predetermined time period. The extreme value E can be a minimum value (MIN) or a maximum value (MAX), depending on the signal that is used for are detection. It is possible to use, e.g., the output voltage of a DC supply, which feeds the plasma process with direct current, as a signal. In this case, the minimum value of the voltage would be determined by the device 5 over a predetermined period. Alternatively, the current fed into the plasma process may be used. In this case, the maximum value of the current would be determined by the device 5 over a predetermined time period. The extreme value detection device 5 can determine the extreme value E by filtering the signal at location 2. Thus, the extreme value detection device 5 includes a filter means that may be designed as a filter of first or higher order, as further described below.

If the extreme value E is the minimum value MIN, the device 5 can filter the minimum value MIN by using different time constants for rising and falling signal values. For example, during minimum value filtering, a larger time constant may be used for a rising flank, i.e., when the signal level changes from a high to a low value. The time constants determine the time period in which the minimum value is searched. The minimum value filtering can be performed in one stage, which can be advantageous due to the small number of components required. Alternatively, the minimum value filtering can be performed in several stages, which reduces the residual ripple at the output of the device 5 and permits faster transient effect in the case of rapid negative voltage changes.

A reference value R is set with a setting means 6. The setting means 6 includes three resistors 7 to 9 connected in series, and the setting means 6 forms a voltage divider with resisters 10, 11. The reference value can be adaptively adjusted in dependence with the plasma process. Thus, there is no need to preset a reference value that must be repeatedly readjusted for different processes. The reference value R is smaller than the determined minimum value MIN. The setting means 6 generates the reference value R from the minimum value MIN and a predetermined deviation PD. In particular, R=MIN−PD. The setting means 6 determines the reference value R by determining a deviation D between the instantaneous value I and the extreme value E and then comparing that deviation D with the predetermined deviation PD that is determined by the minimum value MIN. The predetermined deviation PD can be determined to depend on the extreme value E. In this way, the predetermined deviation PD is permanently adapted in dependance on prevailing plasma process conditions. Thus, it is not necessary to predetermine fixed deviations or reference values that must be reset for each plasma process. In one implementation, the predetermined deviation PD is selected to be about 0.1 to 0.5 times the extreme value E. In another implementation, the predetermined deviation PD is selected to be about 0.2 to 0.4 times the extreme value. Such values provide a safety margin, thus preventing disturbances on the signal from being interpreted as an arc discharge.

The reference value R is supplied to the inverting input of the comparator 4 and compared with the instantaneous value I proportional to the output voltage of the DC current supply.

In one implementation, the comparator 4 changes the level of the arc discharge detection signal at location 12 if the instantaneous value I falls below the reference value R or if the instantaneous value I has reached the reference value R. The signal at location 12 is linked to the control unit that generates an arc signal that is present at location 13. If the ARC signal at location 12 has the level "low", the control unit has initiated elimination of the arc.

Thus, because the reference value R equals the minimum value MIN minus the predetermined deviation PD, the comparator 4 changes the signal level of the arc discharge detection signal at location 12 if the determined deviation D (MIN−I) exceeds the predetermined deviation PD. The predetermined deviation PD can be selected such that a residual ripple (described in greater detail below) of the signal at location 12 or the load current can be neglected.

The extreme value detection device 5 has a two-stage filter. The first stage of the filter includes an RC member consisting of the resistor 11 and a capacitor 14. The resistor 11 and capacitor 14 define a first time constant that is used when a rising flash of the signal fed at location 2 is present. A resistor 15 is provided in parallel with the resister 11. The resister 15 is disposed in series with a non-linear component 16 formed as diode. The resistor 15 is considerably smaller than the resistor 11. The resistor 15 and the capacitor 14 define a second time constant that is smaller than the first time constant and is used when a falling flank of the signal is present. The first state realizes high residual ripple and slow decay in case the voltage rapidly drops down to low values.

The second state of the filter is formed by the resistor 10 and a capacitor 17, wherein the capacitor 17 and the resistor 10 form an RC member. A resister 18 is connected in series with a non-linear component 19, which is formed as diode. The resistor 18 and component 19 are provided in parallel with the resistor 10. The second stage of the filter also uses a first time constant for a rising signal and a second time constant for a falling signal like in the first stage. In this embodiment, a minimum value MIN is determined by the two-stage filter of the extreme value detection device 5. The second filter stage reduces the residual ripple of the signal generated by the first filter stage. Additionally, the second stage realizes rapid decay in case the voltage changes to low values.

Determination of an extreme value E can be stopped by a switch-off means 20, designed as transistor, which is controlled by a signal from a plasma detection device 41 connected at location 21. When ignited plasma has been detected by the plasma detection device 41, the signal fed at location 21 has the signal level "low". This means that the signal fed at location 2 is not pulled to ground by the switch off means 20, and consequently the extreme value E is determined by the extreme value detection means 5. If, in contrast thereto, it is detected that the plasma has not been ignited, a signal level "high" is present at the switch-off means 20, such that the signal fed at location 2 is pulled to ground and no extreme value is formed. In this way, detection of arcs can be stopped when the plasma has not been ignited since no arcs occur if the plasma has not been ignited. While voltage drops may occur during ignition of the plasma, detection of those drops is not needed.

In one implementation, extreme value filtering is performed with a first time constant when the plasma has been ignited and with a second time constant when the plasma has been extinguished. Erroneous detection of arcs during ignition of the plasma due to voltage drops or current increases can thus be prevented or reduced.

A first decoupling element 22, which is designed as diode, is disposed between the extreme value detection device 5 and the comparator 4. A fixed threshold value, e.g., a voltage, is generated or applied at location 23 and is coupled by way of a second decoupling element 24 that is also designed as diode. The fixed threshold value is predetermined. When the voltage on the comparator side of the first decoupled element 22 is smaller than the fixed threshold value, the comparator 4 uses this fixed threshold value as a reference signal for a comparison. When the instantaneous value of the signal from location 2 falls below the fixed threshold value, the arc discharge detection signal indicates an arc. This means that an arc can be detected even when the signal level of the signal coupled at location 2 drops slowly and the extreme value detection device 5 issues very low minimum values.

The threshold value serves as an additional safety for low output voltages in order to prevent detection of arcs in such situations. When the extreme value E that is detected is a minimum value MIN, the occurrence of an arc discharge is detected when the instantaneous value I falls below the fixed threshold value. If, however, the extreme value E that is detected is a maximum value MAX, it is possible that an arc discharge may be detected if the instantaneous value I exceeds the fixed threshold value. Thus, arc discharges or short circuits that develop only very slowly (for example, due to insulating material overload in a cable) can be detected using the fixed threshold value.

In addition thereto, a switched hysteresis circuit 25 is provided to prevent the resetting of the arc discharge detection signal after a short time at high arc drop voltages. The circuit 25 is supplied with the arc discharge detection signal at location 13 to control the instantaneous value of the signal supplied to the comparator 4. If the arc discharge detection signal has a signal level "low", which corresponds to extinguishing of the arc, the transistor 26 is non-conducting and the transistor 27 is therefore conducting. The resistors 28, 29 are thereby connected in parallel, such that the voltage is further divided. The instantaneous value of the signal at location 2 is therefore further reduced, such that only upon an increase in the voltage at location 2 to a value above a threshold value, the signal level of the arc discharge detection signal is reset at location 12. This measure realizes a hysteresis, thereby ensuring that the arc is extinguished when the arc discharge detection signal is reset and has resumed its original state, indicating no arc.

FIG. 2 shows a simulation result of the circuit of FIG. 1. Reference numeral 30 designates the behavior of the instantaneous value I or signal that is applied at the non-inverting input of the comparator 4. As can be seen, the signal 30 has strong ripple. The minimum values MIN 31 of the signal 30 are determined for a predetermined time period. In this drawing, the minimum value MIN is approximately 1.8 V within a time period of approximately 0.2 to 1.4 ms. The setting means 6 produces a reference value R 32 from this minimum value (R=MIN−PD), and the reference value R is approximately 67% of the minimum value MIN 31. If the instantaneous value I of the signal 30 falls below the reference value R 32, as shown at location 33, the signal level of the arc discharge detection signal 34 that is applied at location 12 in FIG. 1 changes. The arc discharge detection signal 34 is supplied to the control unit, which, in turn, generates the arc signal applied at location 13 in FIG. 1 with a time delay or immediately, in dependence on further control signals. When the instantaneous value I (signal 30) drops below the reference value R 32, the arc is detected by comparing the instantaneous value I (signal 30) and the determined minimum value MIN, and changing the level of the arc signal 34 when the difference between the minimum value MIN and the instantaneous value I (signal 30) becomes larger than the predetermined deviation PD, which corresponds to 0.33 times the minimum value MIN in the embodiment shown in FIG. 2. FIG. 2 shows that the reference value R 32 also changes when the minimum value MIN 31 changes. This effects the adjustment of the reference value R. Filtering has the effect that rapid voltage changes, e.g., set-point steps, that occur at locations 35 and 36, are not erroneously interpreted as arcs. The rising flank of the signal 30 at location 35 is filtered with a different time constant than the falling flank at location 36.

FIG. 2 also shows that, when an arc has been detected, the signal 30, in the present case, the voltage, drops. This also means that the reference value R 32 is reduced to lower values. The reference value R 32, however, remains "stuck" at a certain value in the time period after location 33. This value R corresponds to the coupled threshold value. When this threshold value has been exceeded, the level of the arc signal 34 is changed again.

OTHER EMBODIMENTS

It is to be understood that while the invention has been described in conjunction with the detailed description therefore, the foregoing description is intended to illustrate and not limit the scope of the invention, which is defined by the scope of the appended claims. Other aspects, advantages, and modifications are within the scope of the following claims.

What is claimed is:

1. A method of detecting arc discharges in a plasma process, the method comprising:
    determining, using detection circuitry, an extreme value of a signal within a predetermined time period, the extreme value corresponding to a minimum or maximum value of the signal during the predetermined time period;
    comparing a sensed value of the signal, or a value proportional thereto, with the extreme value to determine a difference therebetween; and
    detecting an arc discharge based on the difference exceeding a predetermined deviation;
    wherein the signal is proportional to an output voltage or an output current of a DC supply, and wherein filtering is performed for rising and falling signal values using different time constants.

2. The method of claim 1, further comprising determining the predetermined deviation based on the extreme value.

3. The method of claim 2, wherein the predetermined deviation is selected to be about 0.1 to about 0.5 times the extreme value.

4. The method of claim 2, wherein the predetermined deviation is selected to be about 0.2 to about 0.4 times the extreme value.

5. The method of claim 1, wherein determining the extreme value includes filtering the signal.

6. The method of claim 1, wherein determining the extreme value includes determining a minimum value of the signal by filtering the signal.

7. The method of claim 1, further comprising monitoring the ignition of the plasma of the plasma process.

8. The method of claim 7, wherein detecting the arc discharge is performed only when ignition of the plasma has been detected.

9. The method of claim 7, wherein a first filtering time constant is used when the plasma is being ignited and a second filtering time constant is used when the plasma is extinguished.

10. The method of claim 1, further comprising predetermining a fixed threshold value, and detecting an arc discharge when the sensed value reaches the fixed threshold value.

11. The method of claim 1, further comprising changing a signal level of an arc discharge detection signal upon detection of an arc discharge.

12. The method of claim 11, further comprising changing the signal level of the arc discharge signal with a time delay when the arc discharge extinguishes.

* * * * *